US007447943B2

United States Patent
Vu et al.

(10) Patent No.: US 7,447,943 B2
(45) Date of Patent: Nov. 4, 2008

(54) HANDLING MEMORY ERRORS IN RESPONSE TO ADDING NEW MEMORY TO A SYSTEM

(75) Inventors: Paul H. Vu, Tomball, TX (US); Darrell R. Haskell, Cypress, TX (US); Robert A. Lester, Tomball, TX (US); Timoth W. Majni, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 10/447,118

(22) Filed: May 28, 2003

(65) Prior Publication Data

US 2004/0243884 A1 Dec. 2, 2004

(51) Int. Cl.
   G06F 11/00 (2006.01)
(52) U.S. Cl. .............................. 714/42; 714/5; 710/302; 711/115
(58) Field of Classification Search .................. 714/36, 714/42, 5, 7; 710/302, 301; 711/115
See application file for complete search history.

(56) References Cited

U.S. PATENT DOCUMENTS

| | | | |
|---|---|---|---|
| 6,047,343 A * | 4/2000 | Olarig | 710/302 |
| 6,098,132 A | 8/2000 | Olarig et al. | |
| 6,401,157 B1 * | 6/2002 | Nguyen et al. | 710/302 |
| 6,418,492 B1 | 7/2002 | Papa et al. | |
| 6,487,623 B1 | 11/2002 | Emerson et al. | |
| 6,549,969 B1 * | 4/2003 | Hsu et al. | 710/304 |
| 6,651,138 B2 * | 11/2003 | Lai et al. | 711/115 |
| 2004/0199825 A1 * | 10/2004 | Zeller et al. | 714/36 |

OTHER PUBLICATIONS

"Nonmaskable Interrupt" Microsoft Computer Dicitonary (fifth edition). Copyright 2002. Microsoft Press.*

* cited by examiner

*Primary Examiner*—Robert Beausoliel
*Assistant Examiner*—Philip Guyton

(57) ABSTRACT

A system includes a mechanism to detect addition of a memory module. In response to the addition of the memory module, a memory test is run to test the new memory module for a defect. If an uncorrectable error is detected, a routine is activated to process the error. Depending on whether the defect occurred in the new memory module or existing memory module(s), different processing is performed.

29 Claims, 2 Drawing Sheets

HANDLING MEMORY ERRORS IN RESPONSE TO ADDING NEW MEMORY TO A SYSTEM

BACKGROUND

Computers include various components, such as a central processing unit (CPU), memory, mass storage, and so forth. As software applications executable in such computers have become ever more powerful, the demands placed by such software applications on computing resources, such as memory capacity, of a computer have also increased. Typically, a memory subsystem within a computer is made up of memory modules inserted into one or more memory sockets or slots that are arranged either on the motherboard or a peripheral board in the computer. Empty memory slots are typically available to enable a user to add memory modules to the memory subsystem.

In many computers, adding memory modules to a computer typically involves first shutting down the computer before the memory modules are added. For most desktop or portable applications, shutting down the computer to add memory capacity is usually acceptable. However, most network applications rely upon a network server being available a high percentage of the time. Shutting down a server, or some other type of computer where high availability is useful, to perform memory capacity upgrades may not be desirable.

To address this, hot plugging techniques have been implemented to enable new memory modules to be inserted into available (empty) memory slots in a computer while the system remains live (that is, while the system is operating and remains available).

When adding new memory modules, there is a possibility that the new memory modules may be defective. Conventionally, when a computer detects a defective memory module that cannot be corrected using error detection and correction logic, a system error is indicated that may cause the system to shut down. In such computers, a defect in a newly added memory module may also result in shutdown of the computer, which makes the computer unavailable.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
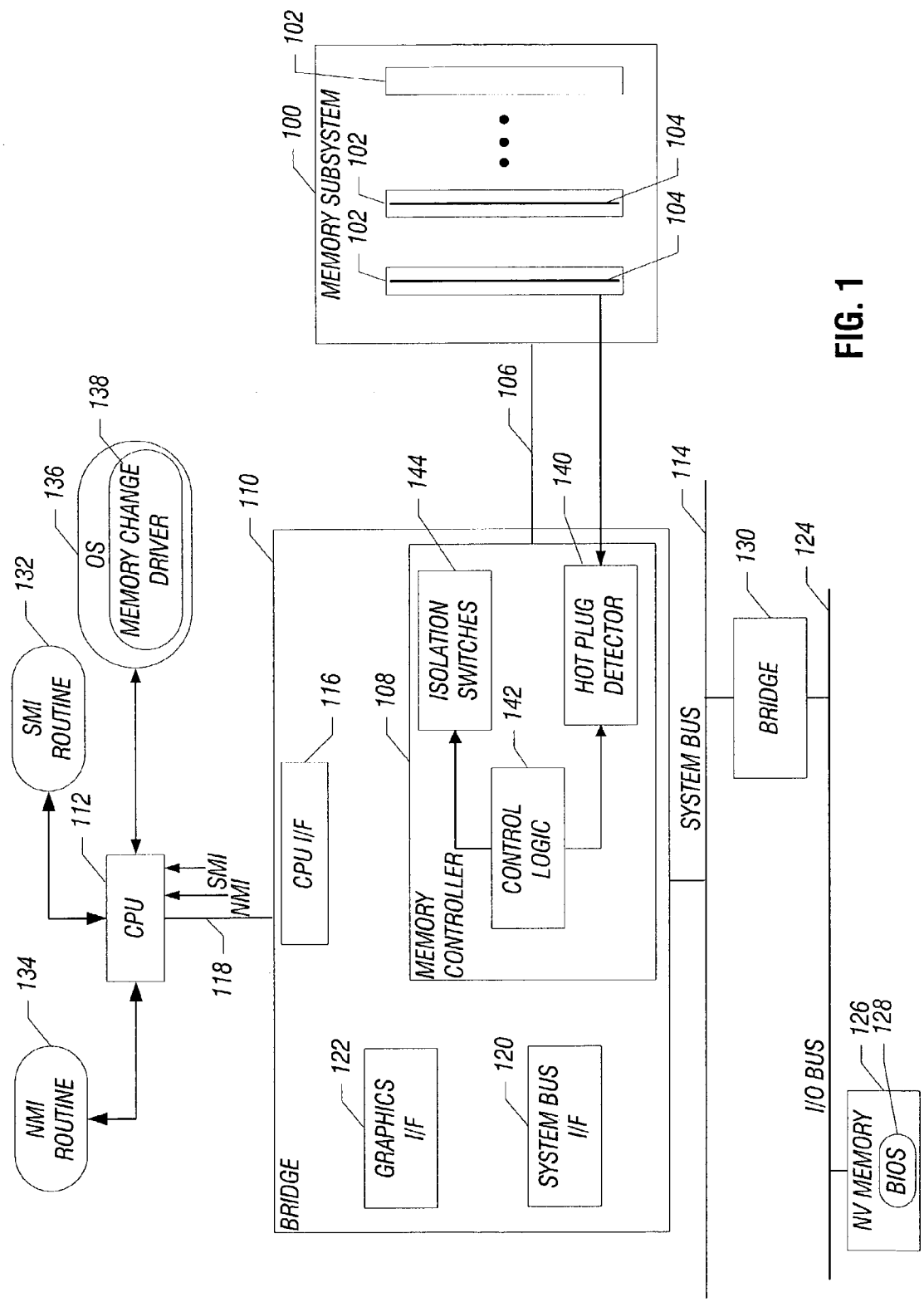
FIG. 1 is a block diagram of an example system incorporating an embodiment of the invention.

FIG. 1 shows an example system, such a computer, that includes a memory subsystem 100, which may be a memory card, a memory cartridge, and so forth. The memory subsystem 100 has multiple memory sockets or slots 102 to receive memory modules 104. As used here, a "memory module" refers to either a unitary memory device (such as a dynamic random access memory (DRAM), a static random access memory (SRAM), and so forth), a multi-unit memory module (such as a single in-line memory module (SIMM), a double in-line memory module (DIMM), and so forth), or any other memory package or assembly that contains one or multiple memory devices.

If the memory subsystem 100 is implemented as a card or cartridge, it is inserted into a connector on a motherboard. Alternatively, the memory slots 102 can be directly mounted onto the motherboard of the system.

In the example of FIG. 1, one or more memory slots 102 are empty and thus available to receive additional memory modules to add to the storage capacity of the memory subsystem 100. A feature according to some embodiments is the ability to insert memory modules into the one or more empty slots 102 while the system remains live (that is, the system is operational and available to a user or software application). The insertion of a memory module into the memory slot 102 while the system remains live is referred to as hot plugging or hot adding the memory module into the system. Another way to add to the capacity of the memory subsystem 100 is to remove an existing memory module from a memory slot and replacing the memory module with a new memory module with added storage capacity.

One of the issues with adding a new memory module to a system is the possibility that the new memory module may be defective (that is, portions of the storage areas of the memory module are defective and thus produce data errors that cannot be corrected using error detection and correction logic available in the system). According to some embodiments of the invention, special processing is performed to handle such errors in an added memory module.

Although described in the context of hot plugging memory modules into a memory slot 102, it should be understood that embodiments of the present invention are also intended to cover systems in which hot plugging of memory modules is not supported.

A memory controller 108 is coupled to the memory subsystem 100. In the example arrangement shown in FIG. 1, the memory controller 108 is provided within a bridge 110 (referred to as a "north" bridge) that is coupled to a central processing unit (CPU) 112 and to a system bus 114. An example of the system bus is a Peripheral Component Interconnect (PCI) bus. In other embodiments, other types of system buses can be employed.

The bridge 110 includes various circuitry and logic to enable components to communicate with each other. In addition to the memory controller 108, the bridge 110 includes a CPU interface 116 that is coupled to a CPU bus (sometimes referred to as a front side bus) 118, which is also connected to the CPU 112. Additionally, the bridge 110 includes a system bus interface 120 that is coupled to the system bus 114. In the example implementation, the bridge 110 also includes a graphics interface 122 that is coupled to a graphics adapter (not shown) to provide graphics capabilities in the system.

In addition to the system bus 114, the system of FIG. 1 also includes an input/output bus 124, such as an Industry Standard Architecture (ISA) bus, an Extended I/O (EIO) bus, an X bus, a low-pin count (LPC) bus, and so forth. A nonvolatile memory 126, which can be implemented with flash memory or electrically erasable and programmable read-only memory (EEPROM), is coupled to the I/O bus 124. Basic input/output system (BIOS) code 128 is stored in the nonvolatile memory 126.

During system start up, the BIOS code 126 is executed by the CPU 112 to perform power-on self-test (POST) tasks. Also, the BIOS code 126 includes various routines, such as system management interrupt (SMI) routines, Advance Configuration and Power Interface (ACPI) routines, and so forth, which can be invoked during operation of the system to perform various tasks, such as power-related tasks and other special tasks.

A bridge 130 is coupled between the system bus 114 and the I/O bus 124 to enable communication between components coupled to the I/O bus 124 and the system bus 114. As noted above, the arrangement of FIG. 1 is provided as an example. In alternative embodiments, other arrangements can be used, including those in which there are not multiple levels of buses as in FIG. 1.

Two types of interrupts are illustrated in FIG. 1, including an SMI and a non-maskable interrupt (NMI), both received by the CPU 112. Activation of the SMI signal causes the CPU to enter into a system management mode (SMM), in which SMI routine(s) 132 are invoked to enable the handling of the system management event. As discussed further below, one of such actions is to determine if an uncorrectable memory error has occurred, and if so, to determine whether the memory error occurred in a new memory module that has been hot-plugged (or otherwise added) to the memory subsystem 100 or in an existing memory module already present in the system.

Another interrupt in the system is the NMI, which when activated causes the CPU to invoke an NMI routine 134 to perform predefined tasks. One such task is to process a system error that occurs due to an uncorrectable memory defect.

In one implementation, both the SMI and NMI signals are activated by the bridge 130 (sometimes referred to as the "south" bridge). In other implementations, SMI and NMI can be generated by other components. Additionally, instead of SMI or NMI, other types of interrupts can be used to handle uncorrectable memory errors.

The system also includes an operating system (OS) 136, which includes a memory change driver 138 to process changes in the memory subsystem (such as addition of a memory module in an empty slot 102 or the replacement of an existing memory module with a new memory module). In response to detection of a new memory module, the memory change driver 138 causes the memory controller 108 to run a test of the new memory module. If an uncorrectable memory error is detected during the memory test, an SMI is generated to handle the event. If the uncorrectable error occurred in an existing memory module rather than a newly added memory module, then NMI is also invoked to handle the system error condition.

When a memory module is added to a memory slot 102 in the memory subsystem 100, a hot plug detector 140 in the memory controller 108 detects the hot plugging of the new memory module. In response, the hot plug detector 140 provides an indication to control logic 142 in the memory controller 108. The control logic 142 controls isolation switches 144, also illustrated as being part of the memory controller 108, to control the coupling of memory signals and power to the newly added memory module.

Although the hot plug detector 140, control logic 142, and isolation switches 144 are shown as being part of the memory controller 108 according to one embodiment, the same elements can be provided outside the memory controller 108 in other embodiments.

Figure 2:
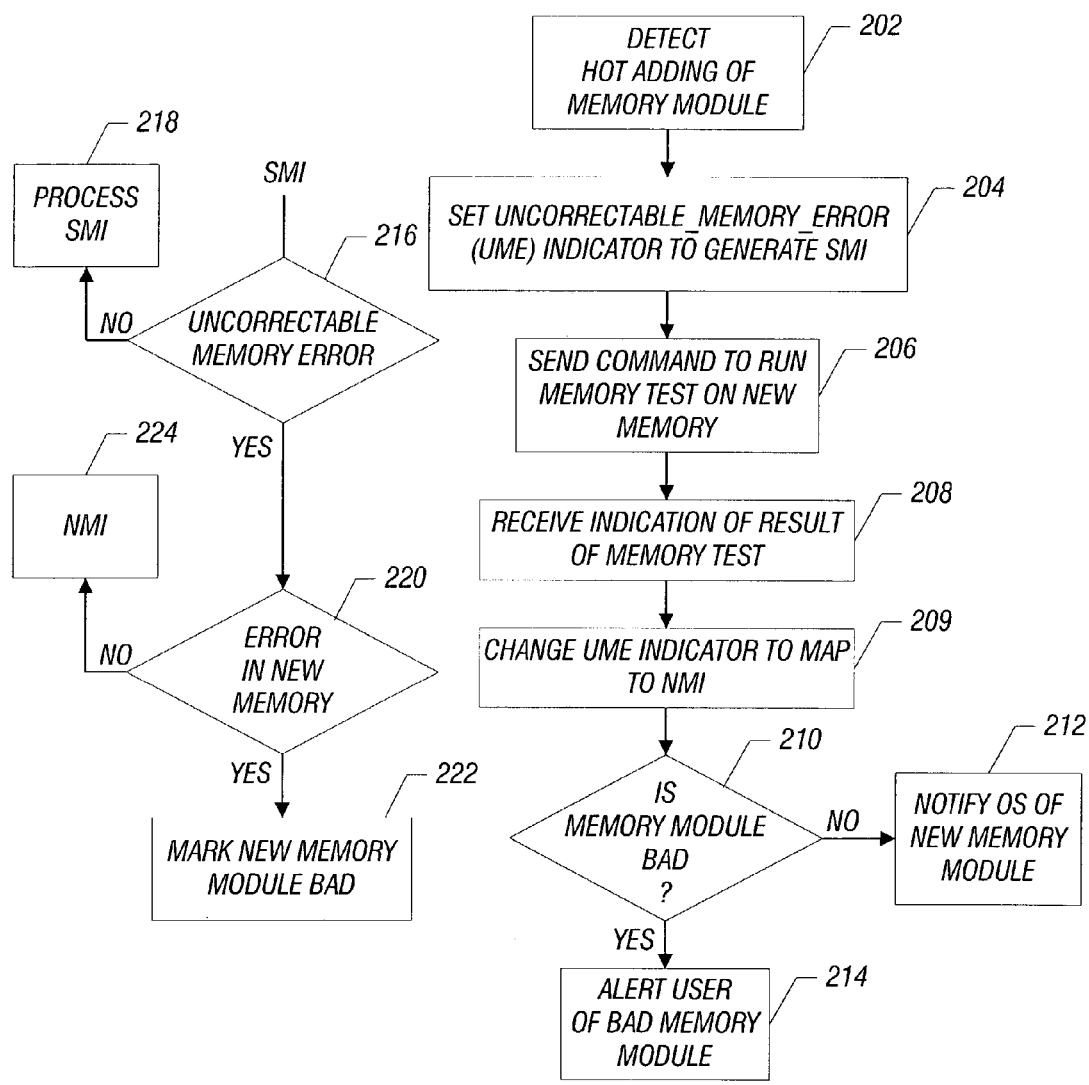
FIG. 2 is a flow diagram of a process according to one embodiment for handling errors in memory.

FIG. 2 shows the process performed according to one embodiment in response to addition of a memory module in the memory subsystem 100. Addition of a memory module refers to either adding the memory module to an empty slot, or replacing an existing memory module with a new memory module. When the hot plug detector 140 detects addition of a new memory module to the memory subsystem, an indication is provided to the control logic 142, which in turn invokes the memory change driver 138, such as by interrupt or by some other mechanism. In another implementation, instead of the memory change driver 138 being part of the operating system 136, the memory change driver is an SMI routine that is part of the BIOS code 126. However, it is contemplated that the memory change driver 138 can be another software module or even a hardware component, such as an ASIC (application-specific integrated circuit), an embedded controller, and the like.

When invoked, the memory change driver 138 detects (at 202) that a new memory module has been added. Next, the memory change driver 138 sets (at 204) a special indicator, referred to as an UNCORRECTABLE_MEMORY_ERROR (UME) indicator, to indicate that an SMI is to be generated in response to the detection of an uncorrectable memory error. Conventionally, the UME indicator is set to map the interrupt to NMI. However, in this implementation according to one embodiment, the UME indicator is set to map the interrupt to SMI rather than NMI before running a test to verify proper operation of the new memory module.

Next, the memory change driver 138 sends a command (at 206) to the memory controller 108 to begin running a memory test of the newly added memory module. This command can be provided in one of various different ways, such as writing a predetermined value to an I/O port associated with the memory controller 108, writing to a command register associated with the memory controller 108, or by some other mechanism.

In response to the command from the memory change driver 138, the memory controller 108 performs a test of the new memory module. This involves writing data values to the new memory module followed by reading data from the new memory module to determine if the storage areas of the new memory module are functioning correctly. The memory controller 108 provides an indication of the results of the memory test back to the memory change driver 138. This indication is received (at 208) by the memory change driver 138. Note that the receipt of such an indication can involve the memory change driver 138 periodically polling a storage location associated with the memory controller 108 to determine when the memory test has completed, and if so, to retrieve the indication of the result of such a memory test. Other mechanisms for providing the indication to the memory change driver 138 are also contemplated.

At this point, the new memory test performed by the memory controller 108 has completed. The memory change driver 138 can then change (at 209) the UME indicator to again perform interrupt mapping to NMI.

The memory change driver 138, upon receiving such indication from the memory controller 108, determines (at 210) if the new memory module is "bad". A bad memory module is defined as a memory module that contains a certain amount and pattern of erroneous bits. In some cases, certain bits of the new memory module may be defective—however, the nature of the erroneous bits may such that an error detection and correction logic implemented in the memory controller 108 is able to correct such errors without data loss. However, in other cases, erroneous bits are such that the error cannot be recovered, which results in an uncorrectable memory error.

If the memory change driver 138 determines that the new memory module is not bad, then the memory change driver 138 notifies (at 212) the operating system 136 of the new memory module. The notification provided to the operating system 136 includes various configuration information associated with the new memory module, such as its size, starting address, the slot it is located in, memory attributes, and so forth.

However, if the memory change driver 138 determines (at 210) that the memory module is bad, an alert is provided (at 214) of such a bad memory module.

Note that the UNCORRECTABLE_MEMORY_ERROR flag or indicator was set (at 204) in the memory controller 108 to indicate that the memory controller 108 is to cause assertion of an SMI in response to detection of an uncorrectable memory error. Issuance of an SMI causes the CPU 112 to invoke the SMI routine 132 to handle the uncorrectable memory error condition.

The SMI routine 132 determines (at 216) if the detected event is an uncorrectable memory error. If not, the SMI event is processed (at 218). Note that the SMI routine 132 can be programmed to handle other events (in addition to uncorrectable memory errors) associated with the memory subsystem 100.

However, if the SMI routine 132 detects (at 216) an uncorrectable memory error, the SMI routine 132 next determines (at 220) if the error occurred in the new memory module. If so, the SMI routine 132 marks (at 222) the new memory module as bad. This prevents the new memory module from being added to the operating system memory pool.

However, if the error did not occur in the new memory module, then that means that the uncorrectable error occurred in existing memory, which is likely to be storing user data or application data (data relating to execution of a software application in the system). An uncorrectable error in an existing memory means that data may be corrupted. As a result, to handle this system error condition, the SMI routine 132 causes (at 224) an NMI to be activated. In one example implementation, the SMI routine 132 sends a command to the south bridge 130, which in response activates NMI.

Activation of the NMI causes the CPU 112 to invoke the NMI routine 134. The NMI routine 134 processes a system error condition relating to an uncorrectable memory error. In one implementation, the system error condition causes the system to shut down to prevent further operation. More generally, the system error condition causes disabling of the system from further normal operation.

Effectively, according to some embodiments, uncorrectable memory errors are handled differently depending on whether the error occurred in existing memory (memory in use and containing user and/or application data) or in new memory. A first interrupt process is performed to handle uncorrectable memory errors in the new memory (e.g., the SMI routine 132 marking the new memory as defective). A second interrupt process is performed to handle uncorrectable memory error in existing memory (e.g., the NMI routine 134 is invoked to handle the system error condition, which may cause shutdown or other disabling of the system). By differentiating between the processing performed under the different conditions, s system error (which may cause system disabling) does not have to be indicated if an error occurs in newly added memory.

Instructions of the various software or firmware modules (e.g., memory change driver 138, SMI routine 132, NMI routine 134, and so forth) discussed herein are loaded for execution on a corresponding control unit or processor. The control unit or processor includes a microprocessor, a microcontroller, a processor module or subsystem (including one or more microprocessors or microcontrollers), or other control or computing devices.

Furthermore, as used here, a "control module" refers to a software module, a hardware module, or a combination of both. Although used in the singular sense, "control module" also refers to a plurality of modules.

Data and instructions (of the various software or firmware modules) are stored in one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method for use in a system, comprising:
   detecting presence of new memory added to a memory slot in the system;
   determining whether an error occurred in the new memory or in existing memory of the system;
   performing first interrupt processing to handle the error in response to determining that the error occurred in the existing memory; and
   performing second, different interrupt processing to handle the error in response to determining that the error occurred in the new memory, wherein the second interrupt processing to handle the error in the new memory prevents the new memory from being added to a memory pool for an operating system.

2. The method of claim 1, wherein performing the first interrupt processing to handle the error in the existing memory comprises disabling the system.

3. The method of claim 2, wherein performing the first interrupt processing comprises performing interrupt processing by a first interrupt routine in response to activation of a first type of interrupt, and wherein performing the second interrupt processing comprises performing interrupt processing by a second interrupt routine in response activation of a second type of interrupt.

4. The method of claim 3, wherein performing the second interrupt processing in response to activation of the second type of interrupt is in response to activation of a system management interrupt (SMI).

5. The method of claim 4, wherein performing the first interrupt processing in response to activation of the first type of interrupt is in response to activation of a non-maskable interrupt (NMI).

6. The method of claim 5, further comprising setting an indicator associated with a memory controller to map an interrupt to SMI rather than NMI for handling an uncorrectable memory error.

7. The method of claim 6, wherein setting the indicator is performed prior to the memory controller running a memory test of the new memory.

8. The method of claim 3, further comprising:
   the second interrupt routine checking whether the error occurred in the new memory or in the existing memory; and
   the second interrupt routine causing the first type of interrupt to be activated in response to the error in the existing memory.

9. The method of claim 1, further comprising marking the new memory as defective in response to determining the error is in the new memory.

10. The method of claim 9, further comprising causing a system error to occur in response to determining the error is in the existing memory.

11. The method of claim 10, wherein causing the system error to occur causes shutdown of the system.

12. The method of claim 10, wherein causing the system error to occur comprises causing activation of a non-maskable interrupt (NMI).

13. The method of claim 12, wherein marking the new memory as defective and causing activation of the NMI is performed by a system management interrupt (SMI) routine.

14. The method of claim 10, wherein causing the system error to occur causes disabling of the system from normal operation.

15. A method for use in a system, comprising:
  detecting hot addition of a new memory module into an available memory slot in the system;
  determining whether an error occurred in the new memory module or in existing memory of the system;
  performing different interrupt processing to handle the error based on whether the error occurred in the new memory module or the existing memory.

16. The method of claim 15, wherein performing the different interrupt processing comprises:
  performing first interrupt processing to handle the error in response to determining that the error occurred in the existing memory; and
  performing second, different interrupt processing to handle the error in response to detecting that the error occurred in the new memory module, wherein the second interrupt processing for handling the error in the new memory module prevents the new memory module from being added to a memory pool of an operating system.

17. The method of claim 16, wherein performing the first interrupt processing to handle the error in the existing memory comprises disabling the system.

18. A method for use in a system, comprising:
  detecting hot replacement of a first memory module with a second memory module in a memory slot in the system;
  determining whether an error occurred in the second memory module or in existing memory of the system; and
  performing different interrupt processing to handle the error based on whether the error occurred in the second memory module or the existing memory.

19. The method of claim 18, wherein performing the different interrupt processing comprises;
  performing first interrupt processing to handle the error in response to determining that the error occurred in the existing memory; and
  performing second, different interrupt processing to handle the error in response to detecting that the error occurred in the second memory module, wherein the second interrupt processing to handle the error in the second memory module prevents the second memory module from being added to a memory pool of an operating system.

20. The method of claim 19, wherein performing the first interrupt processing to handle the error in the existing memory comprises disabling the system.

21. An article comprising at least one computer-readable storage medium containing instructions that when executed cause a system to;
  receive indication of addition of a new memory module to a memory slot in the system:
  determine whether an uncorrectable error occurred in the new memory module or an existing memory module of the system;
  perform first interrupt processing to handle the uncorrectable error in response to determining that the uncorrectable error occurred in the existing memory module; and
  perform second, different interrupt processing to handle the uncorrectable error in response to determining that the uncorrectable error occurred in the new memory module, wherein the second interrupt processing to handle the uncorrectable error in the new memory module prevents the new memory module from being added to a memory pool for an operating system.

22. The article of claim 21, wherein performing the first interrupt processing to handle the error in the existing memory module comprises disabling the system.

23. The article of claim 22, wherein performing the first interrupt processing comprises performing interrupt processing by a first interrupt routine in response to activation of a first type of interrupt, and wherein performing the second interrupt processing comprises performing interrupt processing by a second interrupt routine in response activation of a second type of interrupt.

24. The article of claim 23, wherein performing the second interrupt processing in response to activation of the second type of interrupt is in response to activation of a system management interrupt (SMI).

25. The article of claim 24, wherein performing the first interrupt processing in response to activation of the first type of interrupt is in response to activation of a non-maskable interrupt (NMI).

26. The article of claim 21, wherein the second interrupt processing prevents the operating system from being notified of the new memory module.

27. The article of claim 21, wherein receiving indication of addition of the new memory module comprises receiving indication of detecting hot addition or hot replacement of a memory module into a memory slot.

28. A system comprising:
  an operating system;
  one or more memory slots to receive memory modules;
  a control module adapted to:
    detect presence of a new memory module added to one of the one or more memory slots,
    determine whether an error occurred in the new memory module or an existing memory module.
    perform first interrupt processing in response to determining the error occurred in the new memory module, the first interrupt processing to prevent the operating system from being notified of the new memory module; and
    perform second, different interrupt processing to disable the system in response to determining that the error occurred in the existing memory module.

29. The system of claim 28, wherein the control module detecting presence of the new memory module comprises the control module detecting hot addition or hot replacement of the new memory module in the one memory slot.

* * * * *

UNITED STATES PATENT AND TRADEMARK OFFICE
CERTIFICATE OF CORRECTION

PATENT NO. : 7,447,943 B2 Page 1 of 1
APPLICATION NO. : 10/447118
DATED : November 4, 2008
INVENTOR(S) : Paul H. Vu et al.

It is certified that error appears in the above-identified patent and that said Letters Patent is hereby corrected as shown below:

Title Pg, Item (75), in "Inventors", delete "Timoth" and insert -- Timothy --, therefor.

In column 7, line 45, in Claim 19, delete "comprises;" and insert -- comprises: --, therefor.

In column 7, line 62, in Claim 21, delete "to;" and insert -- to: --, therefor.

In column 8, line 2, in Claim 21, delete "system:" and insert -- system; --, therefor.

In column 8, line 48, in Claim 28, delete "module." and insert -- module, --, therefor.

Signed and Sealed this

Nineteenth Day of May, 2009

JOHN DOLL
*Acting Director of the United States Patent and Trademark Office*